(12) United States Patent
Hsueh et al.

(10) Patent No.: US 8,957,482 B2
(45) Date of Patent: Feb. 17, 2015

(54) ELECTRICAL FUSE AND RELATED APPLICATIONS

(75) Inventors: Fu-Lung Hsueh, Cranberry, NJ (US); Tao Wen Chung, Zhubei (TW); Po-Yao Ke, Dashe Township (TW); Shine Chung, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 409 days.

(21) Appl. No.: 12/731,325

(22) Filed: Mar. 25, 2010

(65) Prior Publication Data

US 2010/0244144 A1    Sep. 30, 2010

Related U.S. Application Data

(60) Provisional application No. 61/165,206, filed on Mar. 31, 2009.

(51) Int. Cl.
*H01L 23/62* (2006.01)
*H01L 27/06* (2006.01)
*H01L 23/525* (2006.01)
(Continued)

(52) U.S. Cl.
CPC .......... *H01L 23/5256* (2013.01); *H01L 27/112* (2013.01); *H01L 27/11206* (2013.01); *H01L 27/101* (2013.01); *H01L 29/785* (2013.01); *H01L 2924/3011* (2013.01)
USPC .................. 257/379; 257/529; 257/E23.149; 257/E27.014

(58) Field of Classification Search
CPC . H01L 27/1112; H01L 27/0629; H01L 27/11; H01L 27/0688

USPC ................... 257/379, 529, E23.149, E27.014
See application file for complete search history.

(56) References Cited

U.S. PATENT DOCUMENTS

| 5,581,202 A | 12/1996 | Yano et al. |
| 5,658,417 A | 8/1997 | Watanabe et al. |

(Continued)

FOREIGN PATENT DOCUMENTS

| CN | 1945829 | 4/2004 |
| CN | 101179046 | 5/2005 |

(Continued)

OTHER PUBLICATIONS

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

(Continued)

*Primary Examiner* — Matthew W Such
*Assistant Examiner* — Monica D Harrison
(74) *Attorney, Agent, or Firm* — Lowe Hauptman & Ham, LLP

(57) ABSTRACT

In various embodiments, the fuse is formed from silicide and on top of a fin of a fin structure. Because the fuse is formed on top of a fin, its width takes the width of the fin, which is very thin. Depending on implementations, the fuse is also formed using planar technology and includes a thin width. Because the width of the fuse is relatively thin, a predetermined current can reliably cause the fuse to be opened. Further, the fuse can be used with a transistor to form a memory cell used in memory arrays, and the transistor utilizes FinFET technology.

30 Claims, 13 Drawing Sheets

(51) Int. Cl.
*H01L 27/112* (2006.01)
*H01L 27/10* (2006.01)
*H01L 29/78* (2006.01)

(56) References Cited

U.S. PATENT DOCUMENTS

| | | | |
|---|---|---|---|
| 5,767,732 A * | 6/1998 | Lee et al. | 327/525 |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Beillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 2003/0080361 A1 | 5/2003 | Murthy et al. | |
| 2003/0109086 A1 | 6/2003 | Arao | |
| 2003/0234422 A1 | 12/2003 | Wang et al. | |
| 2004/0075121 A1 | 4/2004 | Yu et al. | |
| 2004/0129998 A1 | 7/2004 | Inoh et al. | |
| 2004/0192067 A1 | 9/2004 | Ghyselen et al. | |
| 2004/0219722 A1 | 11/2004 | Pham et al. | |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0212080 A1 * | 9/2005 | Wu et al. | 257/529 |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Mantl | |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |
| 2007/0029576 A1 * | 2/2007 | Nowak et al. | 257/209 |
| 2007/0048907 A1 | 3/2007 | Lee et al. | |
| 2007/0076477 A1 | 4/2007 | Hwang et al. | |
| 2007/0093010 A1 | 4/2007 | Mathew et al. | |
| 2007/0093036 A1 | 4/2007 | Cheng et al. | |
| 2007/0096148 A1 | 5/2007 | Hoentschel et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0166929 A1 | 7/2007 | Matsumoto et al. | |
| 2007/0178637 A1 | 8/2007 | Jung et al. | |
| 2007/0221956 A1 | 9/2007 | Inaba | |
| 2007/0236278 A1 | 10/2007 | Hur et al. | |
| 2007/0241414 A1 | 10/2007 | Narihiro | |
| 2007/0247906 A1 | 10/2007 | Watanabe et al. | |
| 2007/0254440 A1 | 11/2007 | Daval | |
| 2008/0001171 A1 | 1/2008 | Tezuka et al. | |
| 2008/0036001 A1 | 2/2008 | Yun et al. | |
| 2008/0042209 A1 | 2/2008 | Tan et al. | |
| 2008/0050882 A1 | 2/2008 | Bevan et al. | |
| 2008/0085580 A1 | 4/2008 | Doyle et al. | |
| 2008/0085590 A1 | 4/2008 | Yao et al. | |
| 2008/0095954 A1 | 4/2008 | Gabelnick et al. | |
| 2008/0102586 A1 | 5/2008 | Park | |
| 2008/0124878 A1 | 5/2008 | Cook et al. | |
| 2008/0227241 A1 | 9/2008 | Nakabayashi et al. | |
| 2008/0265344 A1 | 10/2008 | Mehrad et al. | |

(56) References Cited

U.S. PATENT DOCUMENTS

| | | |
|---|---|---|
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Shikida, Mitsuhiro, et al., "Comparison of Anisotropic Etching Properties Between KOH and TMAH Solutions", IEEE Xplore, Jun. 30, 2010, pp. 315-320.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Office Action dated May 2, 2012 from corresponding application No. CN 201010196345.0.

Office Action dated May 4, 2012 from corresponding application No. CN 201010243667.6.

\* cited by examiner

ELECTRICAL FUSE AND RELATED APPLICATIONS

CROSS-REFERENCE TO RELATED APPLICATIONS

The present application claims priority of U.S. Application Ser. No. 61/165,206, filed on Mar. 31, 2009, the disclosure of which is hereby incorporation by reference herein in its entirety.

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present disclosure is related to electrical fuses. In various embodiments, the fuse is used in an OTP (one time programmable) memory.

BACKGROUND

As the size of planar transistors has been steadily decreasing since their inception, they are expected to suffer from undesirable short channel effects, especially in 32 nm and smaller technologies.

Conventional OTP (one time programmable) memory in MOS (Metal Oxide Silicon) generally takes advantages of thin-oxide breakdown, but experiences disadvantages, including unreliability for production. Because the heat generated in a P/N junction can easily be dissipated in a planar structure, spikes in the P/N junction that can be shorted due to dopant migration or inter-diffusion of contact alloy require extreme high current, such as an ESD (electrostatic discharge) zap, to reliably break the junction. An approach tying the gate with the drain and applying a high voltage to the source for using MOS as OTP is also unreliable.

BRIEF DESCRIPTION OF THE DRAWINGS

The details of one or more embodiments of the invention are set forth in the accompanying drawings and the description below. Other features and advantages of one or more embodiments of the invention will be apparent from the description, drawings, and claims.

Like reference symbols in the various drawings indicate like elements. The drawings are for illustration only and are not to scale.

DETAILED DESCRIPTION

Figure 1:
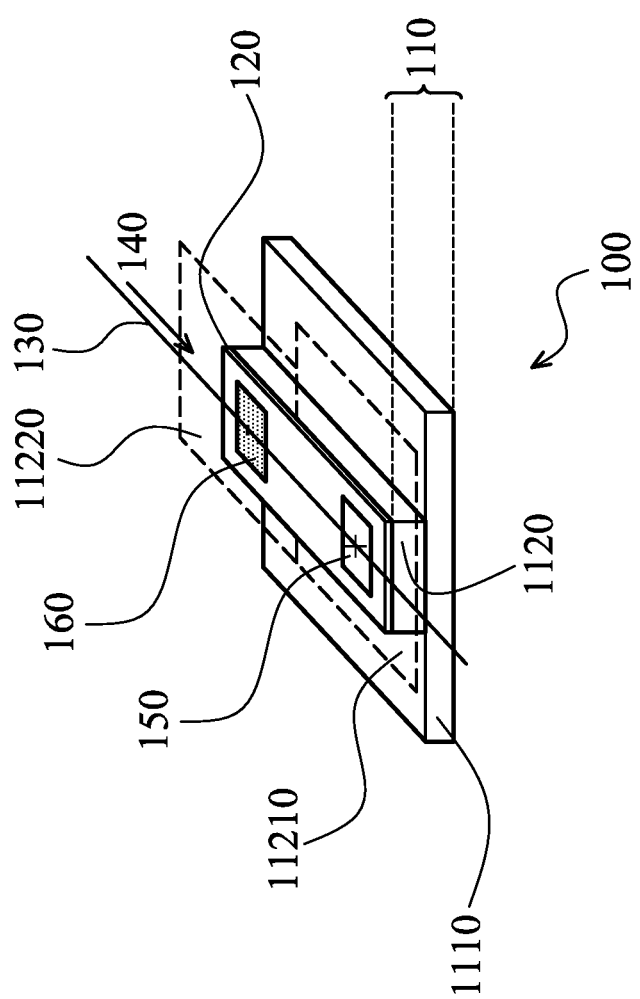
FIG. 1 shows a fuse in accordance with an embodiment of the invention.

Embodiments, or examples, of the invention illustrated in the drawings are now being described using specific languages. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

The Fuse-FinFET Technology

Figure 2:
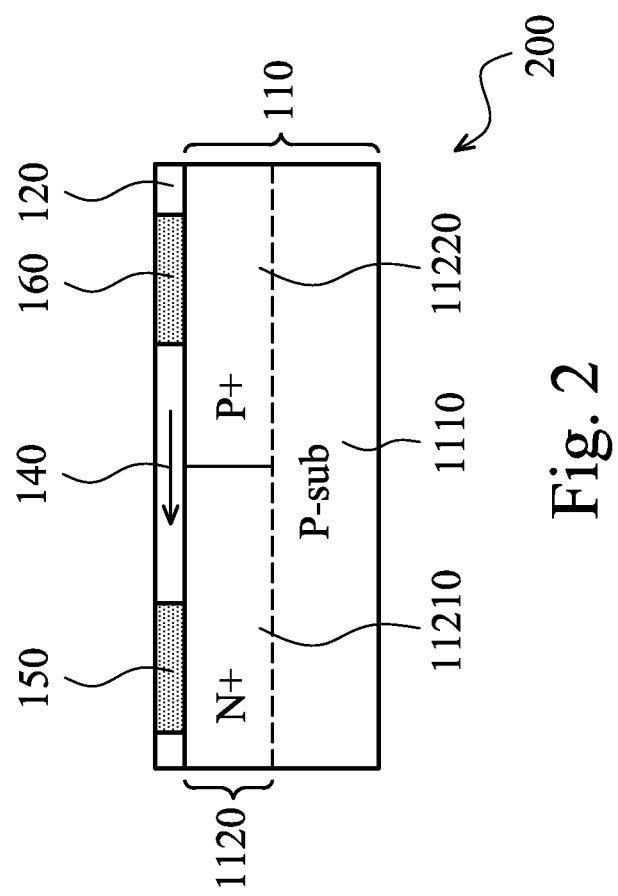
FIG. 2 shows an exemplary cross section of the fuse in FIG. 1.

FIG. 1 shows a fuse 100 in accordance with an embodiment of the invention. FIG. 2 shows an illustrative cross section 200 of fuse 100 along line 130 in FIG. 1. Fuse 100 includes a fin structure 110 and a silicide layer 120.

Fin structure 110 is commonly used in fabricating semiconductor devices including transistors, resistors, etc., and includes a substrate 1110 and a fin 1120. Substrate 1110 and fin 1120 are generally of the same semiconductor material, e.g., silicon or other materials commonly used in the semiconductor art.

Substrate 1110 is of P dopant, and, as a result, may be referred to as a P-substrate or a P-sub. Fuse 100 in the embodiment of FIG. 1 uses a P-sub 1110, but an N-dopant region, such as an N-well, is within the scope of embodiments of the invention. Those skilled in the art will recognize that different dopant types of substrate 1110 will function with different dopant types in other regions of the semiconductor devices, and all are within the scope of embodiments of the invention.

As known in the art, fin 1120 is conductive and very thin compared to substrate 1110. In the embodiment of FIG. 1, fin 1120 includes a first dopant region 11210 and a second dopant region 11220, which are of N+ dopant and P+ dopant, respectively. Regions 11210 and 11220, nevertheless, can be of different dopant types, and are within the scope of embodiments of the invention. When dopant regions 11210 and 11220 are of the same dopant type (e.g., N+ and N+), there would be a space junction region between these two regions 11210 and 11220. However, when dopant regions 11210 and 11220 are of different types (e.g., an N+ and a P+), the PN junction region is automatically formed. Two contact regions 150 and 160 acting as two electrical terminals for fuse 100 are formed separately apart and on top of and in touch with two dopant regions 11210 and 11220, respectively.

Silicide layer 120 comprises silicide, which is a compound that has silicon with more electropositive elements. The chemical bonds in siclides range from conductive metal-like structures to covalent or ionic. Silicide is of different types, examples of which include nickel silicide, calcium silicide, platinum silicide, etc. Silicide layer 120 is conductive and on top of fin 1120, but allows access to contact regions 150 and 160. In fact, silicide layer 120 surrounds contact regions 150 and 160. In accordance with embodiments of the invention, a current 140 can flow through silicide layer 120, but is blocked from leakage in substrate 1110 because dopant regions 11210 and 11220, when appropriate, act as a reverse P-N junction that prevents the current flow. When current 140 is at an appropriate value and direction, it causes high impedance between two contact regions 150 and 160 and/or breaks silicide layer 120 that causes fuse 100 to open. In an embodiment, a current 140 in the range of 6.95 $E^7$ to 8.9 $E^7$ Jg (A/cm2) reliably breaks silicide layer 120 and thus opens fuse 100 due to thin fin 1120 on which fuse 100 is created. As a result, embodiments of the invention are reliable and controllable, resulting in improved manufacturing yields. The range of current 140 can be determined by various factors and technologies, including, for example, the FinFET design rules, the width of fin 1110, the concentration level of P-sub 1110, of dopant regions 11210 and 11220, etc.

The Transistor

Figure 3:
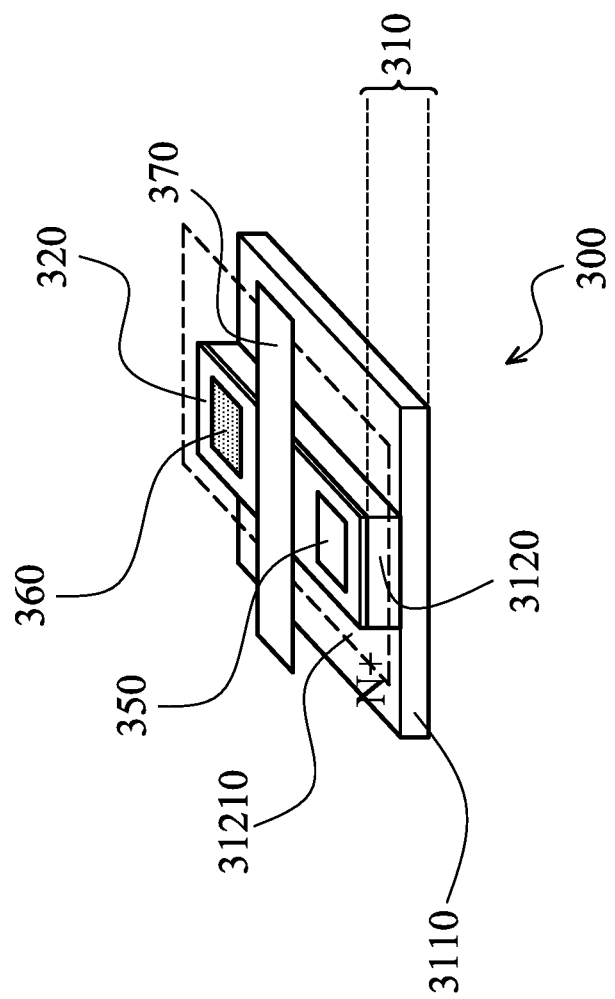
FIG. 3 shows an exemplary transistor that may be used in embodiments of the invention.

FIG. 3 shows an exemplary transistor 300 that can be used with embodiments of the invention. Transistor 300, as shown, is NMOS, and includes a fin structure 310, a silicide layer 320, and a poly region 370. Similar to fin structure 110, fin structure 310 includes a substrate 3110 and a fin 3120. Unlike fin structure 110 that includes two dopant regions 11210 and 11220, fin structure 310 includes only one dopant region 31210 (e.g., N+ region). Further, silicide layer 320 is separated by poly region 370 that constitutes a gate for transistor 300. Poly or polysilicon is silicon at a state commonly used as gate material in semiconductor devices. Two contact regions 350 and 360 serve as terminal contacts for transistor 300.

FIG. 3 shows transistor 300 having one gate 370 and being NMOS, but embodiments of the invention are applicable in transistors having multiple gates and of different technologies, such as PMOS, for example. Further, other technologies for transistor 300 are within scope of embodiments of the invention and should correspondingly function with fuse 100 having different technologies (e.g., N-well sub, P-sub, etc.). For example, depending on applications, an NMOS transistor 300 functions with a P-sub fuse 100 while a PMOS transistor 300 functions with an N-well fuse 100, etc.

The Memory Cell

Figure 4:
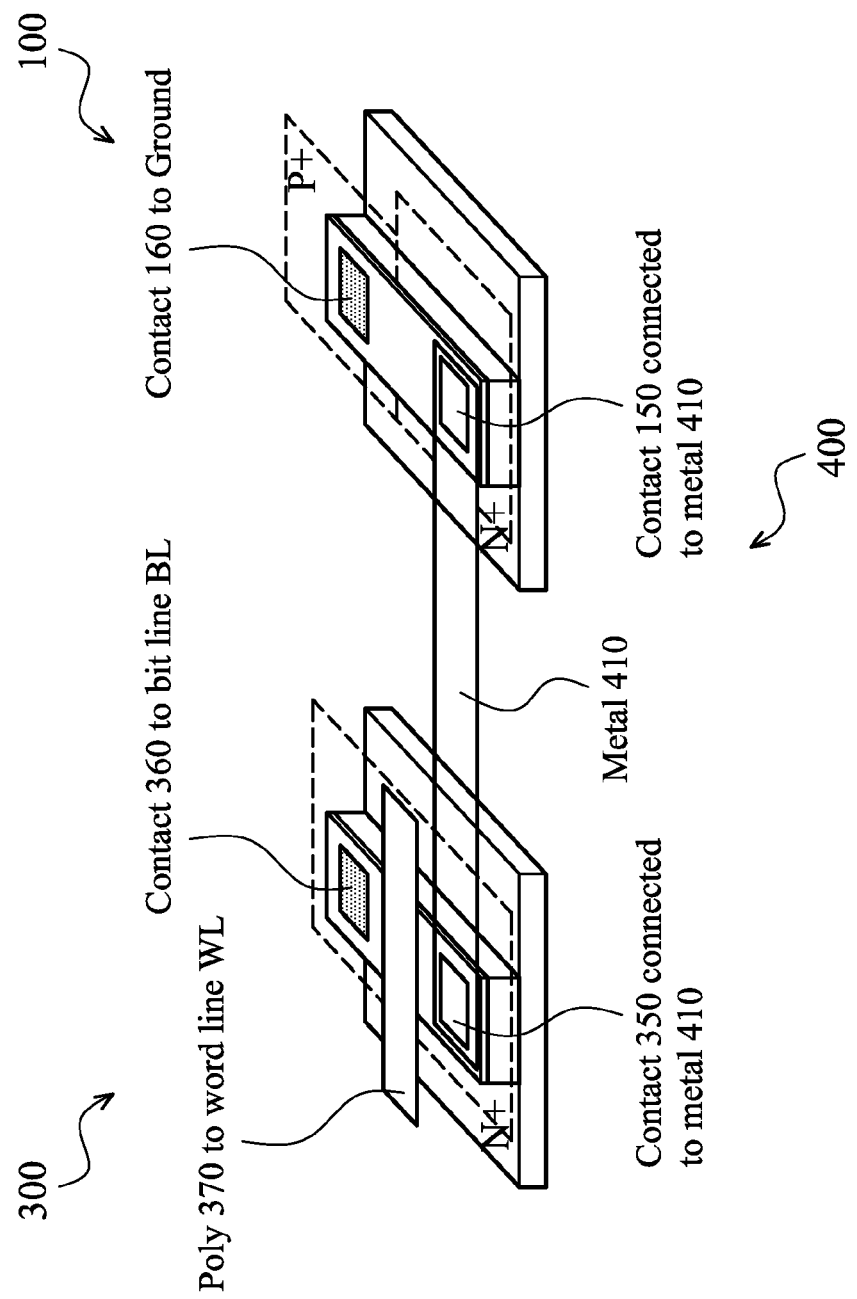
FIG. 4 shows an exemplary memory cell utilizing the fuse in FIG. 1 and the transistor in FIG. 3, in accordance with an embodiment of the invention.
Figure 5:
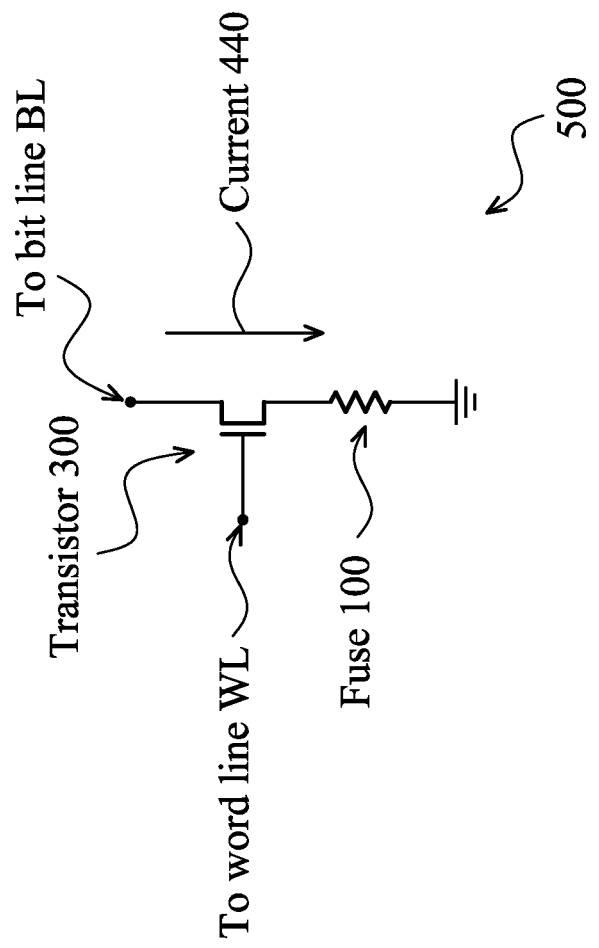
FIG. 5 shows an exemplary circuit representation of the memory cell in FIG. 4.

FIG. 4 shows a memory cell 400, in accordance with an embodiment of the invention. Memory cell 400 includes fuse 100 and transistor 300 that are connected by a metal layer or line 410 via contact regions 150 and 350 of fuse 100 and transistor 300 respectively. Because metal features high electrical conductivity, metal layer 410 allows current flowing through fuse 100 and transistor 300 as appropriate. Contact region 360 and poly region 370 of transistor 300 are connected to a word line WL and a bit line BL, respectively. Contact region 160 of fuse 100 is connected to ground. FIG. 5 shows a circuit 500 indicating circuit representation of a memory cell 400 that includes a fuse 100 and a transistor 300, which are also shown in circuit representation.

In accordance with various embodiments of the invention, a transistor 300 is to select a corresponding fuse 100 in a memory array (e.g., memory array 500 in FIG. 5), and, as a result, may be referred to as a select transistor, a selector MOS, a programming device, etc. Further, the status of fuse 100 (e.g., whether remains closed or open) provides different resistance and thus different logic levels for memory cell 400. When fuse 100 remains closed, its resistance is low, memory cell 400 is at logic low. Conversely, when fuse 100 is open, its resistance is high, memory cell 400 is at logic high. Those skilled in the art will recognize that there are various ways (including a sense amplifier) that may be used to detect the resistance level of fuse 100 and thus the status or logic level of memory cell 400. Further, the logic level of memory cell 400 may be detected by turning on word line WL and detecting the logic level at bit line BL. For example, in the embodiment of FIG. 4, reading memory cell 400 may be done by applying a logic high at word line WL and reading the logic level at bit line BL. As a result, if bit line BL is read as low, then memory cell 400 is at logic low. Conversely, if bit line BL is read as high, then memory cell 400 is at logic high. Further, to program cell 400, word line WL is activated (e.g., applied with a logic high), and an appropriate logic level is applied at bit line BL. For example, in the embodiment of FIG. 4, programming memory cell 400 is done by applying a logic high to both word line WL and bit line BL. When this happens, a current, e.g., current 440 flows from bit line BL through transistor 300, metal line 410, fuse 100 and thus cause fuse 100 to open.

The Memory Array

Figure 6:
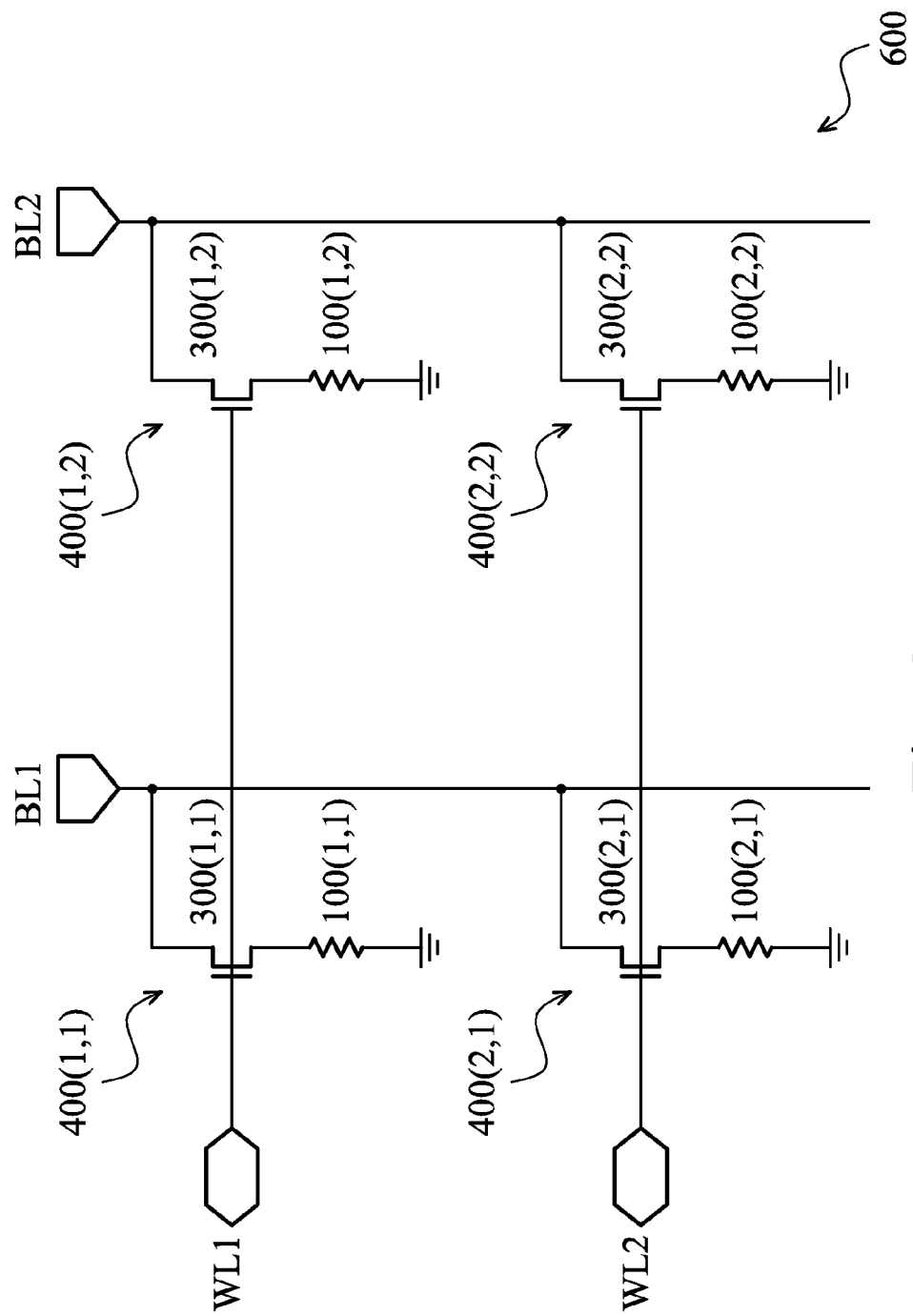
FIG. 6 shows a circuit representation of an example memory array utilizing the fuse of FIG. 1, in accordance with an embodiment.

FIG. 6 shows a circuit representation of a memory array 600 having four memory cells 400 (e.g., 400 (1,1), 400 (1,2), 400 (2,1), 400 (2,2)), in accordance with an embodiment of the invention. Each cell 400 is associated with a word line WL and a bit line BL. For example, cell 400(1,1) is associated with word line WL1 and bit line BL1; cell 400(2,1) is associated with word line WL2 and bit line BL1, cell 400(1,2) is associated with word line WL1 and bit line BL2, etc.

In an embodiment, when a word line WL and a bit line BL corresponding to a memory cell 400 are at logic low, the corresponding fuse 100 stays closed with low resistance. As a result, the corresponding memory cell 400 is at logic low. Similarly, when the same word line WL and bit line BL are applied a logic high, while the rest of the word lines WL and bit lines BL in the memory array 600 remain low, a current (e.g., current 440) flows from the bit line BL through the corresponding transistor 300 of the memory cell 400 and opens the corresponding fuse 100, causing it to be high resistance. As a result, the corresponding memory cell 400 is at logic high. For example, when all word lines (e.g., word lines WL1 and WL2) and bit lines (e.g., bit lines BL1 and BL2) are at logic low, all cells 400(1,1), 400(1,2), 400(2,1) and 400(2,2) in memory array 600 are at logic low. Further, when all other word lines WL and bit lines BL are at logic low but word line WL1 and bit line BL1 are at logic high, current 440 flows from bit line BL1 through transistor 300(1,1) and opens fuse 100(1,1) causing its resistance to be high, resulting in a logic high for memory cell 400(1,1). Similarly, when all other word lines WL and bit lines BL are at logic low and word line WL2 and bit line BL1 are at logic high, a current (e.g., current 440) flows from bit line BL1 through transistor 300(2,1) and opens fuse 100(2,1), causing it to be high resistance, and resulting in logic high for cell 400(2,1).

Memory array 600 is shown to have four cells 400 in a two rows by two columns configuration for illustration purposes only, embodiments of the invention are applicable in arrays having cells 400 in various configurations with different number of cells 400 per row or per column. Further, embodiments of the invention are applicable for other cells in a memory array of different sizes that function similarly to the cells 400 in the examples described above.

Method of Creating a Fuse

Figure 7:
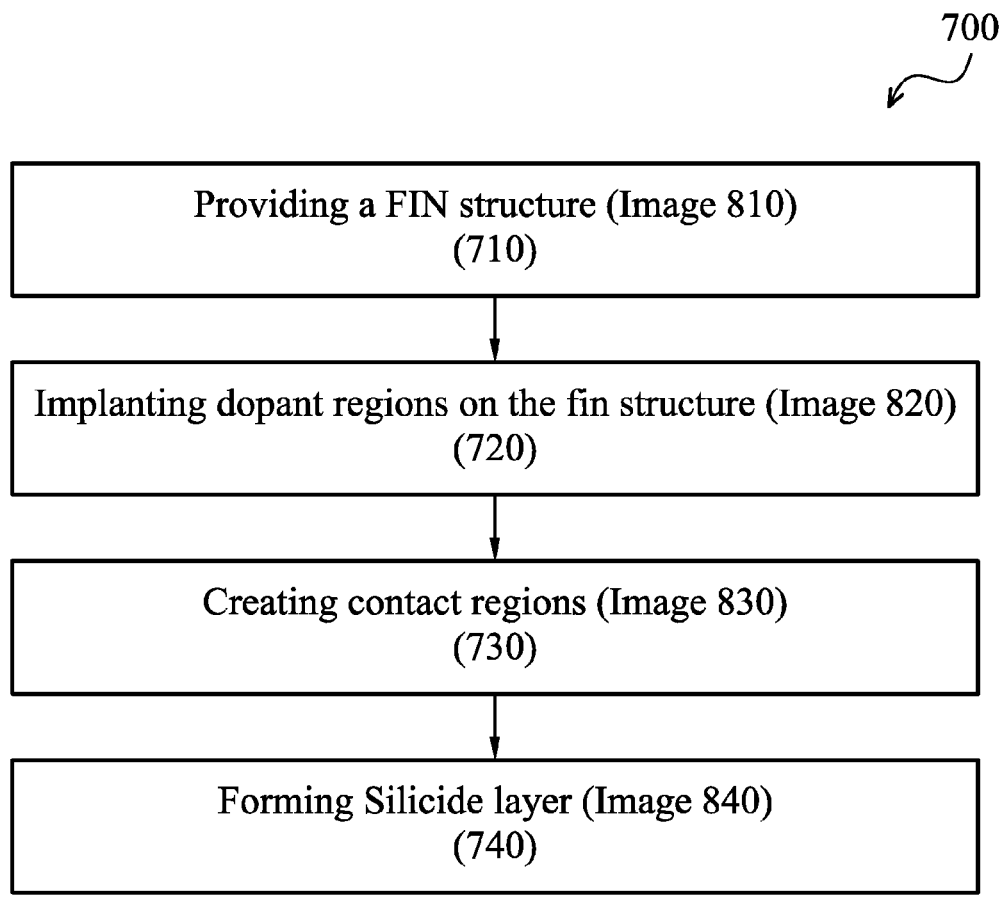
FIG. 7 shows a flowchart illustrating a method, in accordance with an embodiment, for creating the fuse in FIG. 1.
Figure 8:
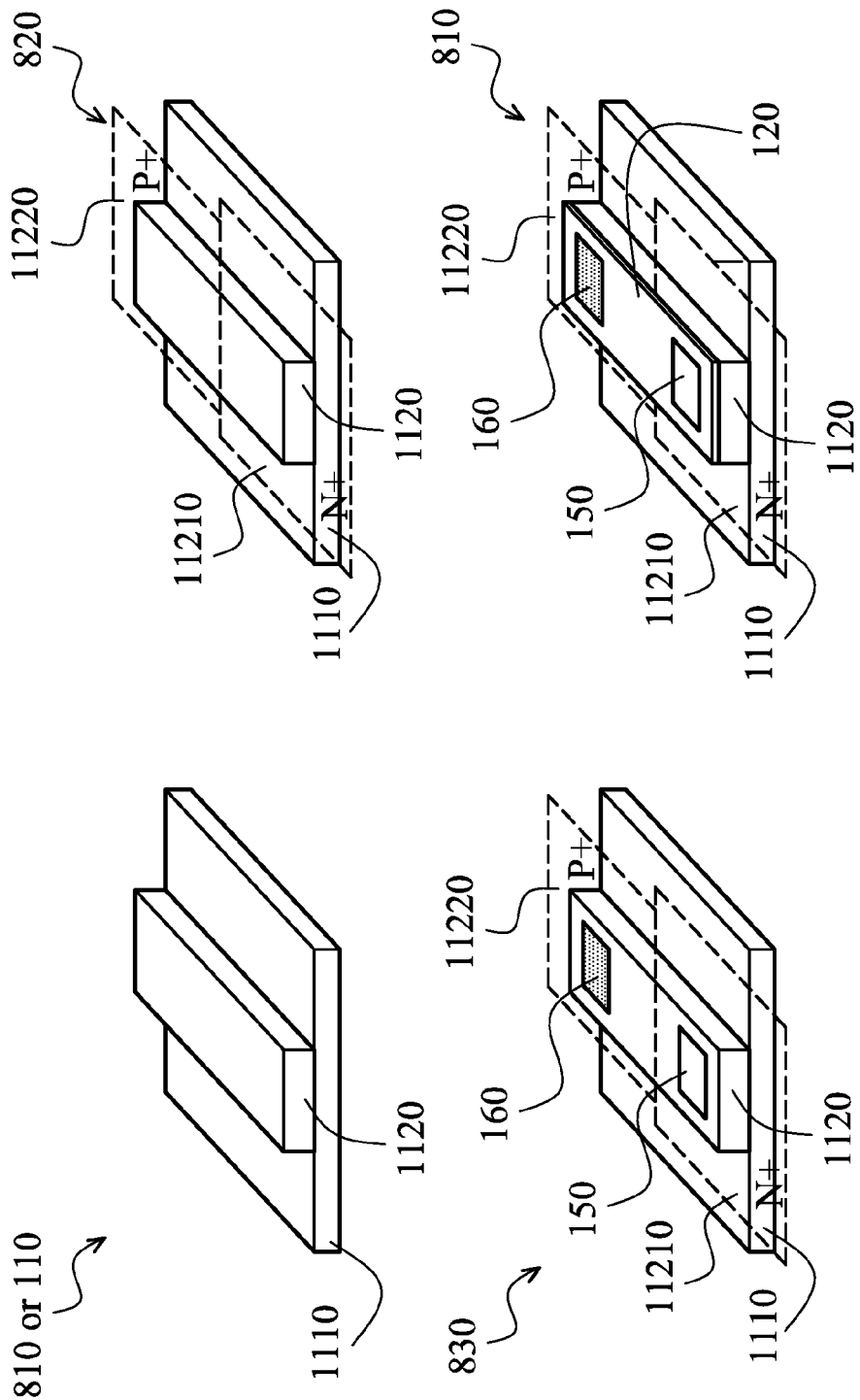
FIG. 8 shows illustrative images while the fuse of FIG. 1 is being created in accordance with the method in FIG. 7.

FIG. 7 shows a method 700 illustrating creation of a fuse, e.g., fuse 100, in accordance with an embodiment of the invention. FIG. 8 shows corresponding images 810-840 while fuse 100 is being created using the method embodiment of FIG. 7. Images 810, 820, 830, and 840 in FIG. 8 correspond to blocks 710, 720, 730, and 740 in FIG. 7, respectively.

In block 710, a fin structure, e.g., fin structure 110 that includes substrate 1110 and fin 1120 (as image 810), is provided In block 720, dopant regions, e.g., regions 11210 and 11220, are implanted on fin 1120, resulting in image 820.

In block 730, contact regions, e.g., regions 150 and 160, are formed, resulting in image 830.

In block 740, a silicide layer, e.g., layer 120, is formed, resulting in image 840, or, in fact, fuse 100.

Implanting dopant regions, forming contact regions, growing the silicide layer in blocks, 720, 730, and 740 may be done using various techniques known in the art, and the invention is not limited to any particular technique.

The Fuse-Planar Technology

Figure 9:
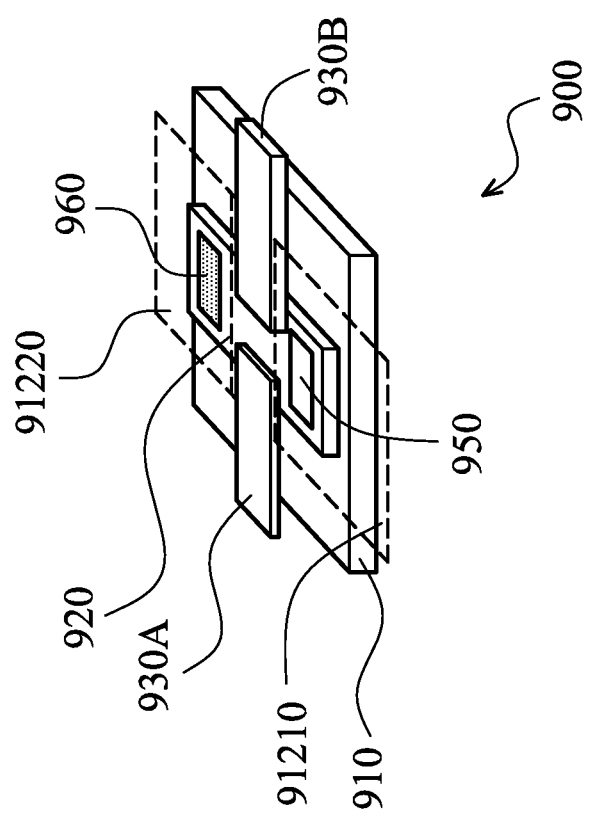
FIG. 9 shows a fuse using planar technology, in accordance with an embodiment.
Figure 10:
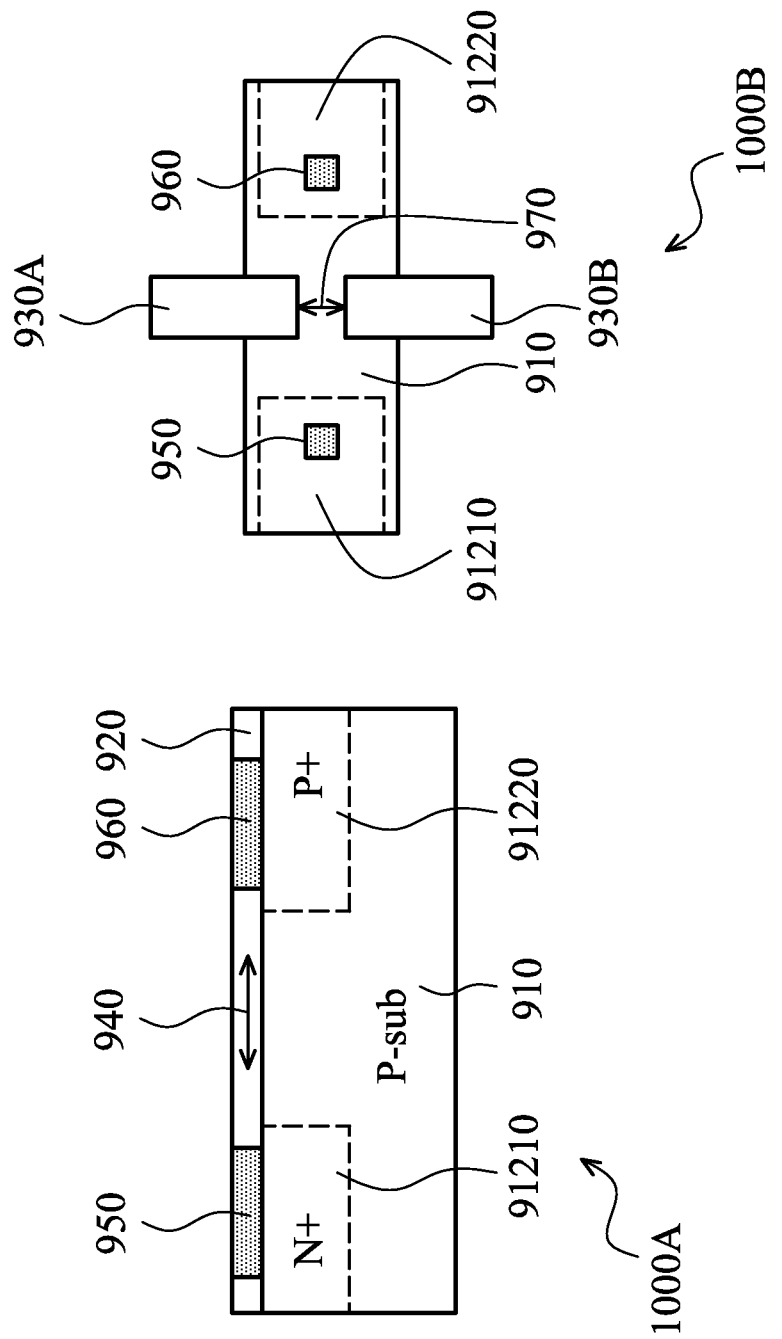
FIG. 10 shows an illustrative cross section and a top view of the fuse in FIG. 9.

FIG. 9 shows a fuse 900 using planar technology, in accordance with an embodiment of the invention. FIG. 10 shows a cross section 1000A and a top view 1000B of fuse 900.

Fuse 900 includes a substrate 910, a silicide layer 920, poly regions 930A and 930B, dopant regions 91210 and 91220, contact regions 950 and 960. Silicide layer 920 is formed on top of substrate 910. Dopant regions 91210 and 91220 are formed in substrate 910, separately apart from one another, and under and in contact with silicide layer 920. Contact regions 950 and 960 are formed on top of dopant regions 91210 and 91220, respectively. Silicide layer 920 surrounds contact regions 950 and 960, but allows access to them.

Poly regions 930A, 930B are formed on top of silicide layer 920 and define a width 970 for fuse 900. In an embodiment, the value of width 970 is defined based on a design rule regarding separation of poly regions 930A and 930B and the desired current (e.g., current 940) used to operate (e.g., open) fuse 900. Selecting an appropriate width 970 is a design choice considering this current 940 as an input. The smaller the width 970 the easier for fuse 900 to open, and, conversely, the larger the width 970 the harder for fuse 900 to open. Further, the higher the current flowing through silicide layer 920, the easier for fuse 900 to open, and, conversely, the lower the current flowing through silicide layer 920, the harder for fuse 900 to open. Depending on implementations, a width 970 may be selected first and an appropriate current 940 is selected to operate with this selected width. Alternatively, a current 940 may be selected first and a width 970 is selected to operate with this selected current. In various embodiments, width 970 is selected as a minimum space allowed between two poly regions 930A and 930B, and current 940 is selected to operate fuse 900 based on this width. Those skilled in the art will recognize that different technologies have different design rules to define the minimum width of the two poly regions (e.g., poly regions 930A and 930B), and embodiments of the invention are not limited to any particular technology or design rule. Further, fuse 900 in the embodiment of FIG. 9 uses poly, but other materials that can be used to define the fuse width are within scope of embodiments of the invention. Embodiments of the invention are not limited to any particular material.

As compared to fuse 100, there is no fin structure on which silicide layer 920 is formed. In the embodiment of FIG. 9, silicide layer 920 sits directly on substrate 910.

Similar to fuse 100, fuse 900 normally remains closed, and when a current, e.g., current 940 flows through fuse 900, this current would open fuse 900.

Figure 11:
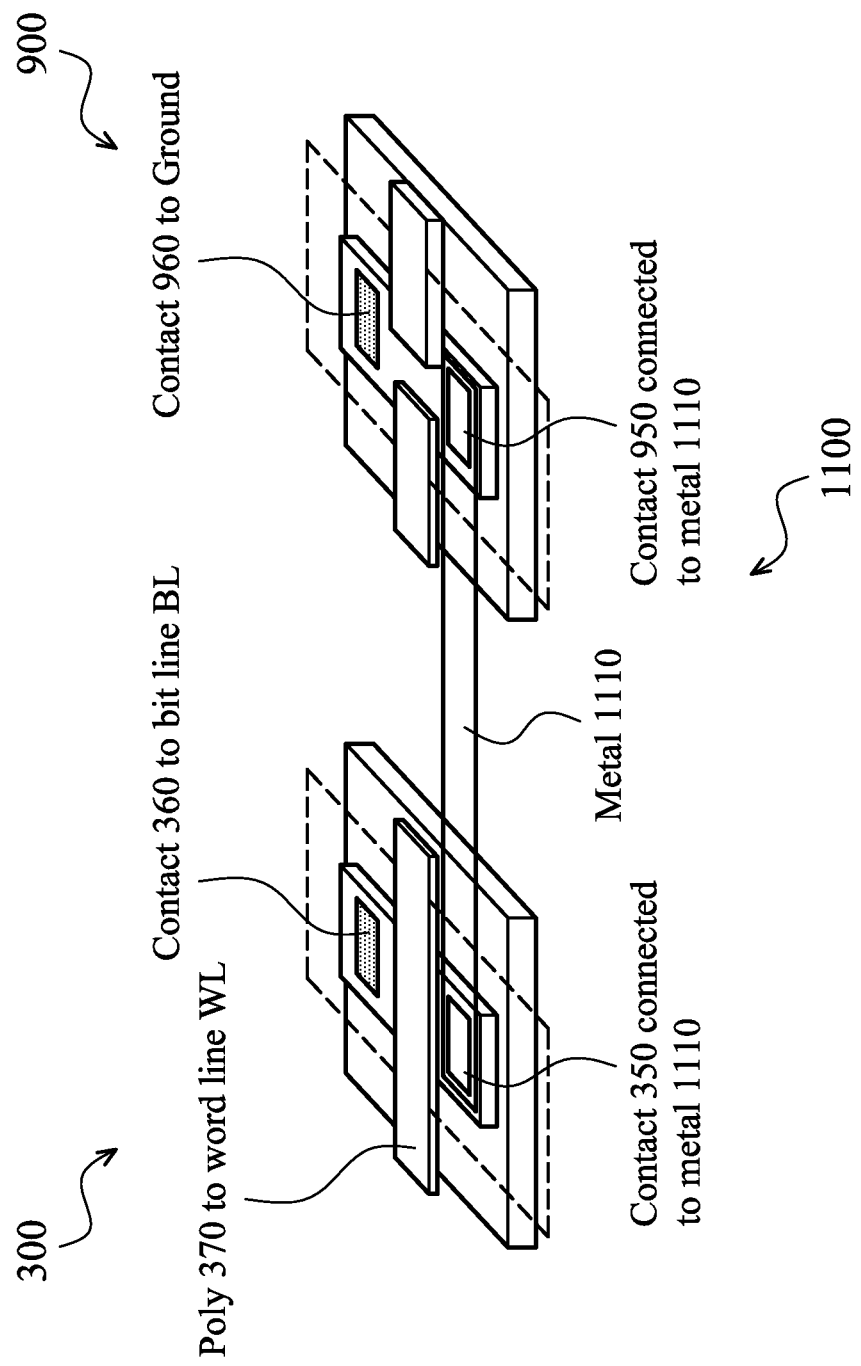
FIG. 11 shows a memory cell using the fuse in FIG. 9, in accordance with an embodiment.

FIG. 11 shows a memory cell 1100 that uses transistor 300 and fuse 900, in accordance with an embodiment of the invention. Similar to memory cell 400, via contact regions 350 and 950, transistor 300 is connected through a metal layer 1110 to fuse 900 to form memory cell 1100. Contact 360 and poly 370 of transistor 300 are connected to word line WL and bit line BL, respectively. Contact 960 of transistor 900 is connected to ground. Operation of memory cell 1100 is similar to that of memory cell 400. Further, various memory cells 1100 may form various memory arrays in accordance with the spirit and scope of embodiments of the invention; one similar example was illustrated in FIG. 6.

Method of Creating a Planar-Technology Fuse

Figure 12:
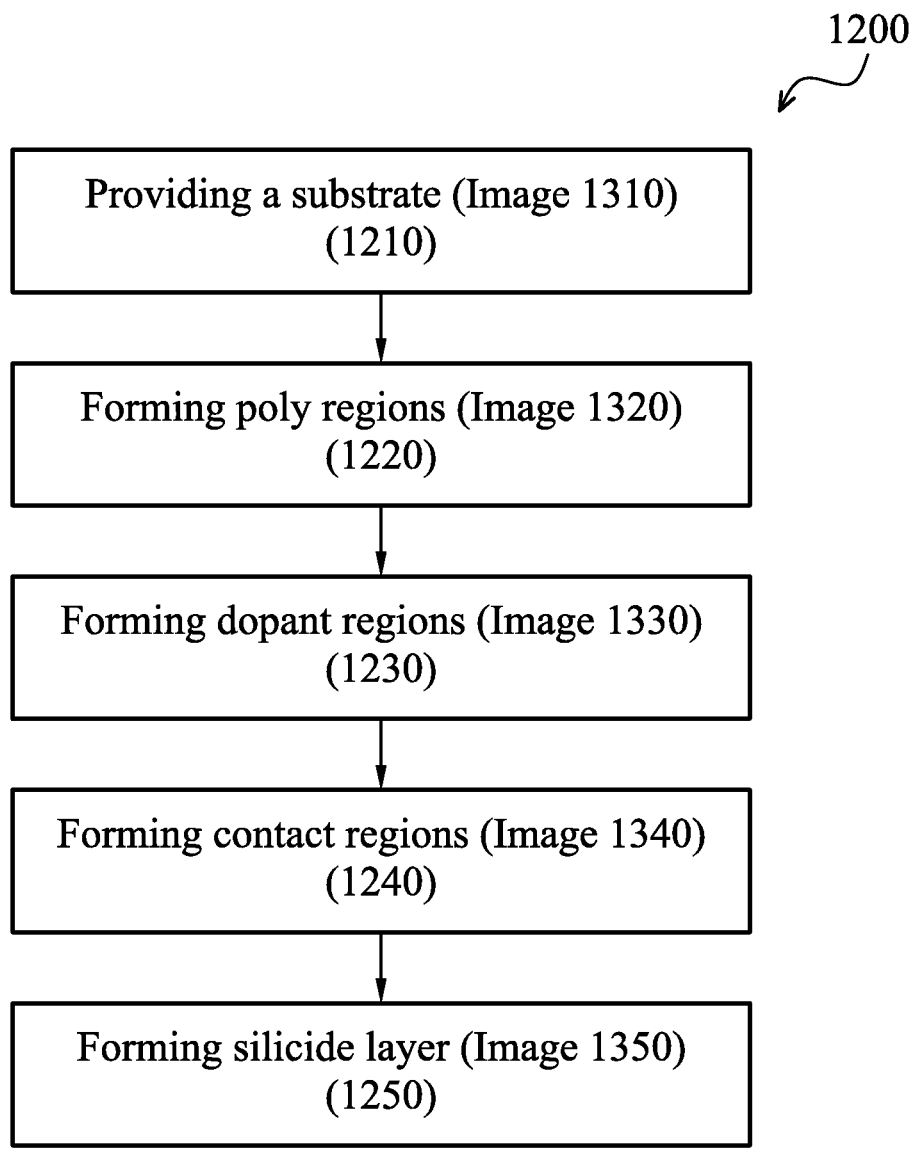
FIG. 12 shows a flowchart illustrating a method, in accordance with an embodiment, for creating a fuse of FIG. 9.
Figure 13:
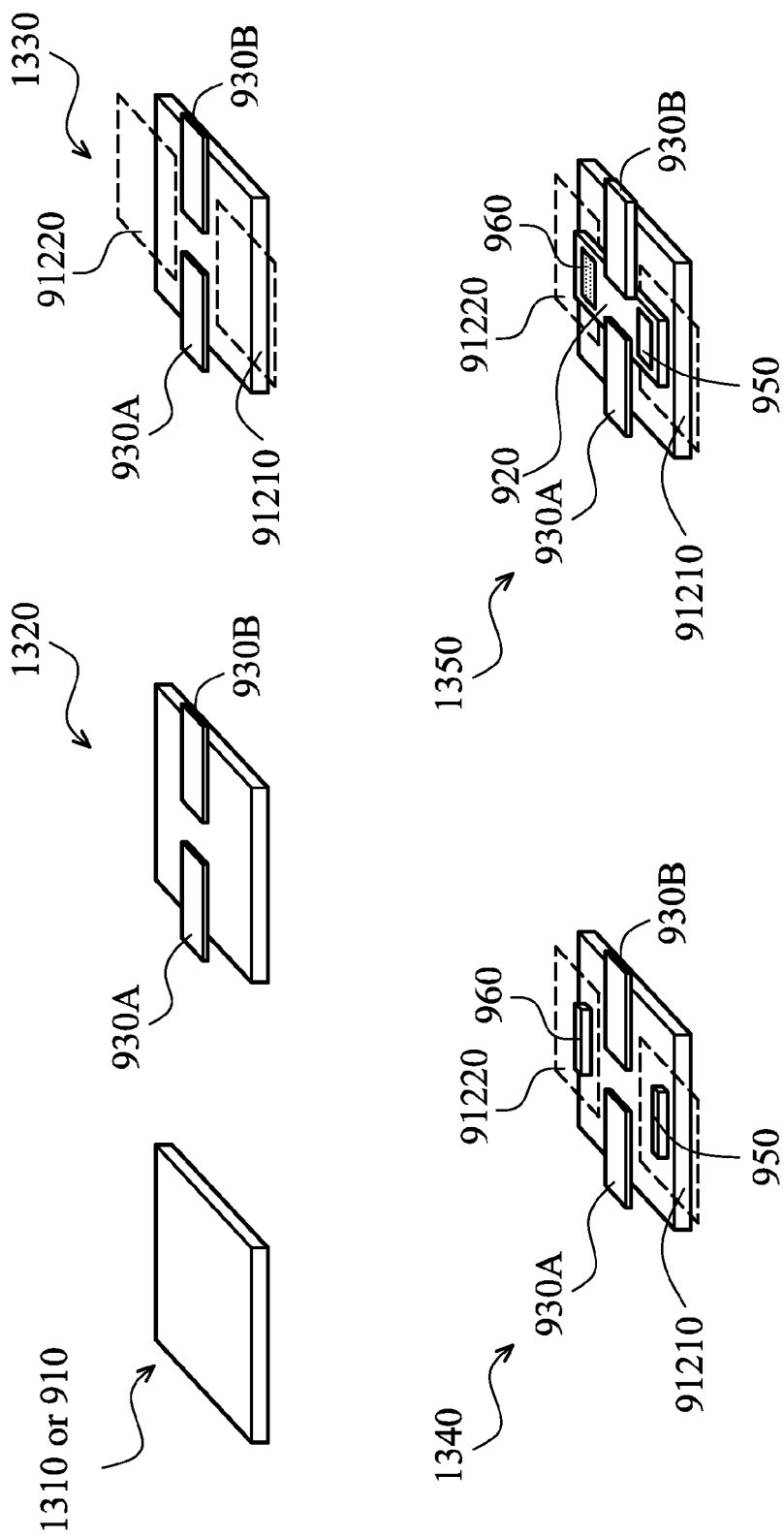
FIG. 13 shows illustrative images while the fuse in FIG. 9 is being created using the method in FIG. 12.

FIG. 12 shows a flowchart 1200 illustrating a method of creating a planar-technology fuse (e.g., fuse 900), in accordance an embodiment of the invention. FIG. 13 shows corresponding images 1310-1350 while fuse 900 is created using the method embodiment of FIG. 12.

In block 1210, substrate 910 is provided, shown as image 1310.

In block 1220, poly regions 930A and 930B are formed on substrate 910, resulting in image 1320. Width 970 is considered as explained above in forming these poly regions 930A and 930B.

In block 1230, dopant regions 91210 and 91220 are formed, resulting in image 1330.

In block 1240, contact regions are 950 and 960 are formed, resulting in image 1340.

In block 1250, silicide layer 920 is formed, resulting in image 1350, which is, in fact, fuse 900.

The above steps in blocks 1220-1250 may be performed using various techniques known in processing semiconductor devices, and embodiments of the invention are not limited to any particular technique.

A number of embodiments of the invention have been described. It will nevertheless be understood that various modifications may be made without departing from the spirit and scope of the invention. For example, as discussed above, a P-sub 110 can be replaced by an N-well 110; a PMOS, instead of NMOS, transistor may be used with an N-well fuse to form a memory cell; to form a memory cell, an NMOS transistor is to function with a P-sub fuse, and a PMOS transistor is to function with an N-well fuse, etc. Further, principles of the invention are applicable with different concentration levels of dopant regions, including substrate (or well) 110, dopant regions 11210 and 11220, etc. Additionally, any material that has the same or similar characteristics as silicide may be used as silicide layer (e.g., layer 120 or 920), and the invention is not limited to a particular material.

The above method embodiments show exemplary steps, but they are not necessarily required to be performed in the order shown. Additionally, steps may be added, replaced, changed order, and/or eliminated as appropriate, in accordance with the spirit and scope of embodiment of the invention. For example, it is not necessary that contact regions 950 and 960 (and poly regions 930A and 930B) are to be formed in a particular order, but one region may be formed concurrently or non-concurrently with the other one.

Embodiments of the invention are related to electrical fuses. In various embodiments, the fuse is formed from silicide and on top of a fin of a fin structure. Because the fuse is formed on top of a fin, its width takes the width of the fin, which is very thin. Depending on implementations, the fuse is also formed using planar technology and includes a thin width. Because the width of the fuse is relatively thin, a predetermined current can reliably open the fuse. Further, the fuse can be used with a transistor to form a memory cell used in memory arrays, and the transistor utilizes FinFET technology.

Embodiments of the invention can have one or a combination of the following features and/or advantages. Embodiments are controllable, reliable, and improve manufacturing yields because a current in a predictable range can reliably open the fuse. Embodiments block current leakage under a silicide region that forms the fuse. Embodiments can be advantageously used in OTP memory being known for effective and low cost.

Each claim of this disclosure constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. An electrical fuse comprising:
   a conductive layer;
   a fin region that is part of a semiconductor fin structure, is below and in contact with the conductive layer, and includes
   a first region having a first dopant conductivity;
   a second region having a second dopant conductivity; and
   a junction between the first region and the second region;
   a first contact region disposed over the first region and coupled to a first side of the conductive layer; and
   a second contact region disposed over the second region and coupled to a second side of the conductive layer;
   wherein the first contact region and the second contact region act as terminals for the electrical fuse; and
   wherein the semiconductor fin structure further comprises a substrate, the fin region formed on the substrate, and the substrate and the fin region being of an exactly same semiconductor material.

2. The electrical fuse of claim 1 wherein the conductive layer comprises silicide.

3. The electrical fuse of claim 1 wherein the first region comprises N+ doped material, the second region comprises P+ doped material, and the junction between the first region and the second region is a P-N junction.

4. The electrical fuse of claim 3 wherein the substrate has either P or N doped material.

5. The electrical fuse of claim 1 being open when a current flows through the conductive layer.

6. The electrical fuse of claim 1 having an open state that depends on a current flowing through the conductive layer and a width of the fin region.

7. The electrical fuse of claim 1 wherein the conductive layer is configured to allow a current flowing therethrough, and the junction between the first region and the second region is configured to block current leakage in the substrate.

8. The electrical fuse of claim 1, wherein both the first and second regions comprise N+ doped material.

9. The electrical fuse of claim 1, wherein the first region, the second region and the junction between the first region and the second region have a same thickness.

10. A memory cell comprising:
    a transistor having a first transistor contact region and a second transistor contact region;
    an electrical fuse having a first fuse contact region and a second fuse contact region; the electrical fuse being formed on top of a fin of a FinFET structure and defining a logic level of the memory cell; the first fuse contact region and the second fuse contact region acting as terminals of the fuse;
    a conductive line connecting the first transistor contact region and the first fuse contact region; the second transistor contact region being used to detect the logic level of the memory cell;
    wherein the FinFET structure comprises a substrate and a fin formed on the substrate, the substrate and the fin being of an exactly same semiconductor material.

11. The memory cell of claim 10 wherein the electrical fuse comprises silicide.

12. The memory cell of claim 10 wherein the transistor comprises more than one gate.

13. The memory cell of claim 10 wherein the transistor comprises NMOS and the fuse comprises a P substrate or the transistor comprises PMOS and the fuse comprises an N well.

14. The memory cell of claim 10 wherein the logic level of the memory cell is determined based on impedance between the first fuse contact region and the second fuse contact region.

15. The memory cell of claim 10 wherein the logic level of the memory cell is determined through a bit line coupled to the second transistor contact region.

16. The memory cell of claim 10, wherein the fuse includes
a first region that is disposed under the first fuse contact region and comprises N doped material,
a second region that is disposed under the second fuse contact region and comprises P doped material, and
a P-N junction between the first region and the second region.

17. The memory cell of claim 10, wherein the fuse includes
a first region that is disposed under the first fuse contact region and comprises doped material,
a second region that is disposed under the second fuse contact region and comprises doped material of a same dopant conductivity as the doped material of the first region, and
a space junction between the first region and the second region.

18. A semiconductor fuse, comprising:
a substrate;
a first layer formed on top of the substrate;
a first dopant region and a second dopant region that are
separately apart from one another;
formed in the substrate; and
under and in contact with the first layer;
a first terminal and a second terminal that are
formed on top of the first dopant region and the dopant second region, respectively;
in contact with the first layer; and
act as terminals for the fuse; and
a third region and a fourth region that are
formed on top of the first layer; and
separately apart from one another; a space between the third region and the fourth region forms a width of the fuse.

19. The fuse of claim 18 wherein the first layer comprises silicide.

20. The fuse of claim 18 wherein the first dopant region and the second dopant region comprise a same dopant material but different from that of the substrate.

21. The fuse of claim 18 wherein the space is defined by a minimum width allowed by a design rule between the third region and the fourth region.

22. The fuse of claim 18 wherein the first dopant region and the second dopant region comprise N+ material and the substrate comprises P material.

23. The fuse of claim 18, wherein
the first dopant region and the second dopant region are spaced from each other in a first direction;
the third region and the fourth region are spaced from each other in a second direction perpendicular to the first direction; and
the third region and the fourth region comprise a material different from those of the first layer, the first dopant region, and the second dopant region.

24. A memory cell, comprising:
a transistor;
an electrical fuse coupled to the transistor and including
a substrate;
a first dopant region and a second dopant region formed in the substrate and spaced from each other in a first direction;
a first layer formed on top of the substrate;
a third region and a fourth region formed on top of the first layer; wherein a space between the third region and the fourth region in a second direction different from the first direction forms a width of the fuse; and
a first terminal and a second terminal; and
a logic level determined by impedance between the first terminal and the second terminal.

25. The memory cell of claim 24 wherein the first layer comprises silicide.

26. The memory cell of claim 24 wherein the third region and the fourth region comprise poly.

27. The memory cell of claim 24 wherein the logic level of the memory cell changes state when a current flows from a bit line through the transistor, the first terminal and the second terminal.

28. An electrical fuse comprising:
a conductive layer;
a fin region that is part of a semiconductor fin structure, is below and in contact with the conductive layer, and includes
a first region having a first dopant conductivity;
a second region having a second dopant conductivity; and
a junction between the first region and the second region;
a first contact region disposed over the first region and coupled to a first side of the conductive layer; and
a second contact region disposed over the second region and coupled to a second side of the conductive layer;
wherein the first contact region and the second contact region act as terminals for the electrical fuse; and
wherein the semiconductor fin structure further comprises a substrate, the fin region formed on the substrate, and the substrate and the fin region being integrally formed.

29. The electrical fuse of claim 28 wherein the substrate and the fin region are of a same semiconductor material.

30. The electrical fuse of claim 28 wherein the first region comprises N+ doped material, the second region comprises P+ doped material, and the junction between the first region and the second region is a P-N junction.

* * * * *